United States Patent [19]
Nishida et al.

[11] Patent Number: 5,398,271
[45] Date of Patent: Mar. 14, 1995

[54] EXPOSURE APPARATUS

[75] Inventors: Jun Nishida; Norio Uchida, both of Kanagawa; Nobutaka Kikuiri, Tokyo, all of Japan

[73] Assignee: Kabushiki Kaisha Toshiba, Kanagawa, Japan

[21] Appl. No.: 184,754

[22] Filed: Jan. 18, 1994

Related U.S. Application Data

[60] Division of Ser. No. 7,827, Jan. 22, 1993, which is a continuation of Ser. No. 786,749, Nov. 1, 1991.

[30] Foreign Application Priority Data

Nov. 19, 1990 [JP] Japan ................................ 2-313284

[51] Int. Cl.⁶ .............................................. G21K 5/00
[52] U.S. Cl. ...................................... 378/34; 378/210
[58] Field of Search .................................... 378/34

[56] References Cited

U.S. PATENT DOCUMENTS

| | | | |
|---|---|---|---|
| 4,475,223 | 10/1984 | Taniguchi et al. | 378/34 |
| 4,870,668 | 9/1989 | Frankel et al. | 378/34 |
| 4,969,168 | 11/1990 | Sakamoto et al. | 378/34 |
| 5,197,089 | 3/1993 | Baker | 378/208 |

FOREIGN PATENT DOCUMENTS

0360272A2  3/1990  European Pat. Off. .

OTHER PUBLICATIONS

Brochure for SUSS XRS 200 X-Ray Stepper by Karl Suss, Inc.

*Primary Examiner*—Craig E. Church
*Attorney, Agent, or Firm*—Finnegan, Henderson, Farabow, Garrett & Dunner

[57] ABSTRACT

A exposure apparatus for a semiconductor wafer, a liquid crystal display panel and so on. The exposure apparatus comprises a light source, a holding means and a moving means. The light source exposes a target such as a semiconductor wafer, a liquid crystal display panel and so on. The holding means alternately holds and releases the target. The moving means for moving the holding means includes a table and a shifting means. The table moves in the direction of the light source. The shifting means shifts the holding means toward or against the table.

9 Claims, 4 Drawing Sheets

EXPOSURE APPARATUS

This application is a division of application Ser. No. 08/007,827, filed Jan. 22, 1993, now abandoned, which is a continuation of application Ser. No. 07/786,749, filed Nov. 1, 1991, now abandoned.

BACKGROUND OF THE INVENTION

1. Field of the Invention

This invention relates to an exposure apparatus for producing an Ultra Large Scale Integrated Circuit (ULSI), a liquid crystal display panel and so on.

2. Description of the Related Art

X-ray exposure apparatus have been developed as an exposure apparatus to produce ultra large scale integrated circuits (ULSI). The X-ray exposure apparatus use X-rays from synchrotron orbital radiation (SOR) as an exposure source. By this kind of X-ray exposure, fine circuit patterns of a width not more than 0.2 $\mu$m can be transformed to semiconductor wafers.

A conventional structure of such an X-ray exposure apparatus is shown in FIG. 1 and FIG. 2. FIG. 2 shows a plane view of the structure shown in FIG. 1.

Referring these Figures, on a wafer stage frame 11, a wafer table 13 is installed. The wafer table 13 comprises four stages. These are an X-stage 15, a Y-stage 17, a Z-stage 19 and $\theta$-stage 21. The wafer table 13 has six degrees of freedom which are the X-direction, Y-direction, Z-direction and $\theta$-rotation, consisting of $\theta$x-rotation, $\theta$y-rotation and $\theta$z-rotation, with use of these stages respectively. In front of the wafer table 13, a wafer chuck plate 23 is attached, which can hold and release alternately an exposure target such as a semiconductor wafer 25 by vacuum chucking. On the other hand, a mask 27, in which circuit patterns are described, is connected to a mask frame 31 with a mask chuck plate 29. The mask 27 is placed against the semiconductor wafer 25 and held by the mask chuck plate 29 by vacuum chucking.

First the position of the semiconductor wafer 25 is moved in X-, Y-direction, $\theta$x-, $\theta$y- and $\theta$z-rotation by the three stages, X-stage 15, Y-stage 17, $\theta$-stage 21. Then the position of the semiconductor wafer 25 is adjusted with the Z-stage 19 to be close to the mask 27 and the gap g between the semiconductor wafer 25 and the mask 27 is fixed. The circuit patterns in the mask 27 are transferred on the semiconductor wafer 25 by the exposure of X-ray emission from SOR. The gap g would be in about 10 to 50 $\mu$m.

When the semiconductor 25 is attached on or released from the wafer chuck plate 23, or when the mask 27 is attached on or released from the mask chuck plate 29, the wafer stage 11 is moved in the X-negative direction represented by an arrow 33 as shown in FIG. 3, and sufficient space between the wafer chuck plate 23 and mask chuck plate 29 is secured for the operation of attaching or releasing to be done. The wafer stage frame 11 is so heavy that it takes a long time to move from an exposure position to an attaching and releasing position. The apparatus including the moving means for this heavy stage frame should become a large-scaled apparatus.

SUMMARY OF THE INVENTION

Accordingly, it is an object of the present invention to provide a exposure apparatus which can hold the gap g closely and tightly, and expose a target such as a semiconductor wafer, and further can exchange a target or a mask easily and rapidly.

To accomplish the above-described object, an exposure apparatus is provided which comprises:
a light source for exposing;
a holding means for alternately holding and releasing a target; and,
a moving means, for moving the holding means between a first position where the target is alternately held and released and a second position where the target is exposed, including a table which moves in the direction of the light source and a shifting means for shifting the holding means toward or against the table.

BRIEF DESCRIPTION OF THE DRAWINGS

These and objects and advantages of this invention will become more apparent and more readily appreciated from the following detailed description of the presently preferred exemplary embodiments of the invention taken in conjunction with the accompanying drawings wherein.

DESCRIPTION OF THE PREFERRED EMBODIMENTS

Figure 1:
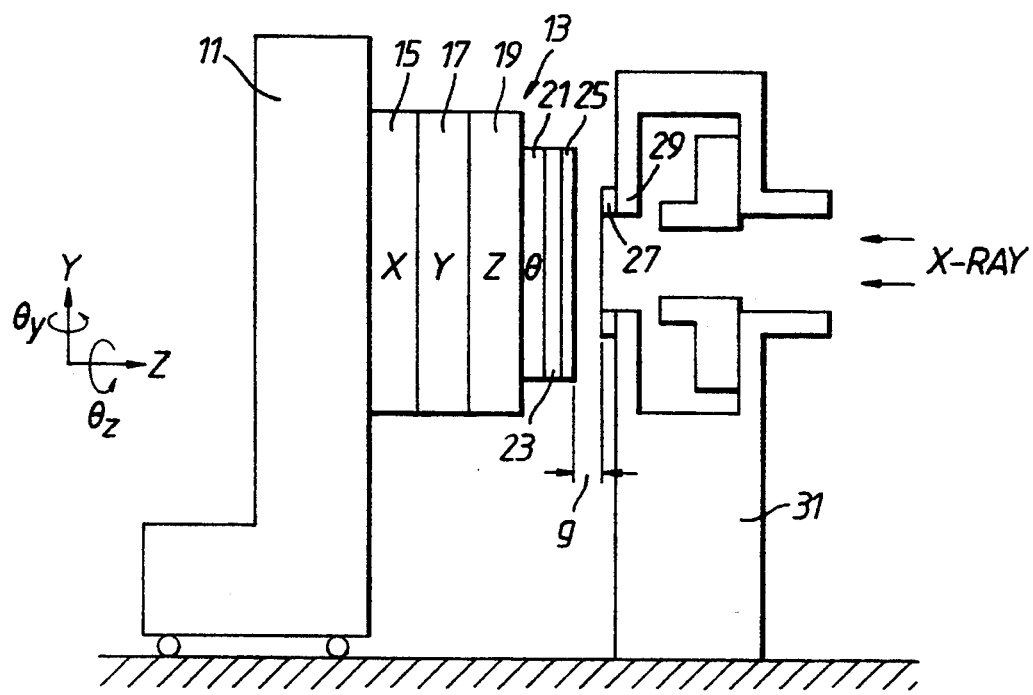
FIG. 1 shows a vertical sectional view of a conventional exposure apparatus.
Figure 2:
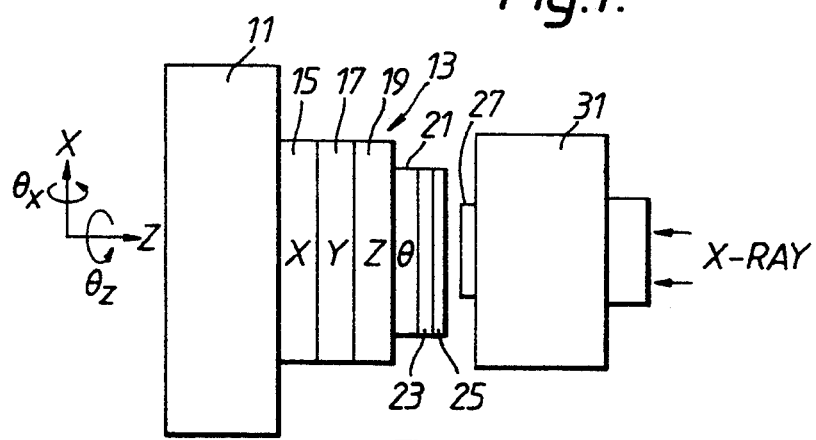
FIG. 2 and FIG. 3 show partial plan views of a conventional exposure apparatus.
Figure 3:
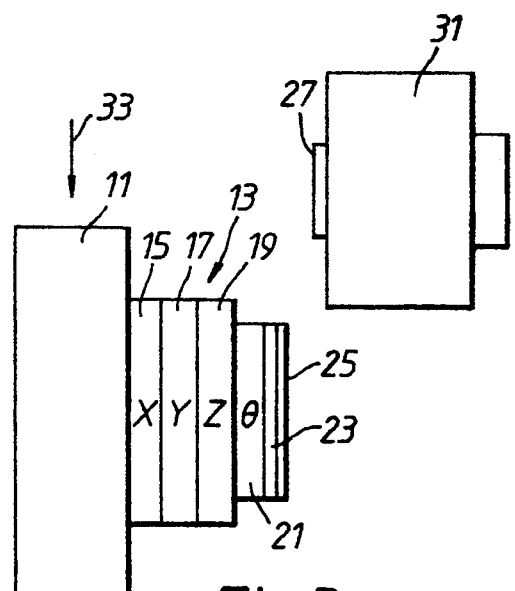
Figure 4:
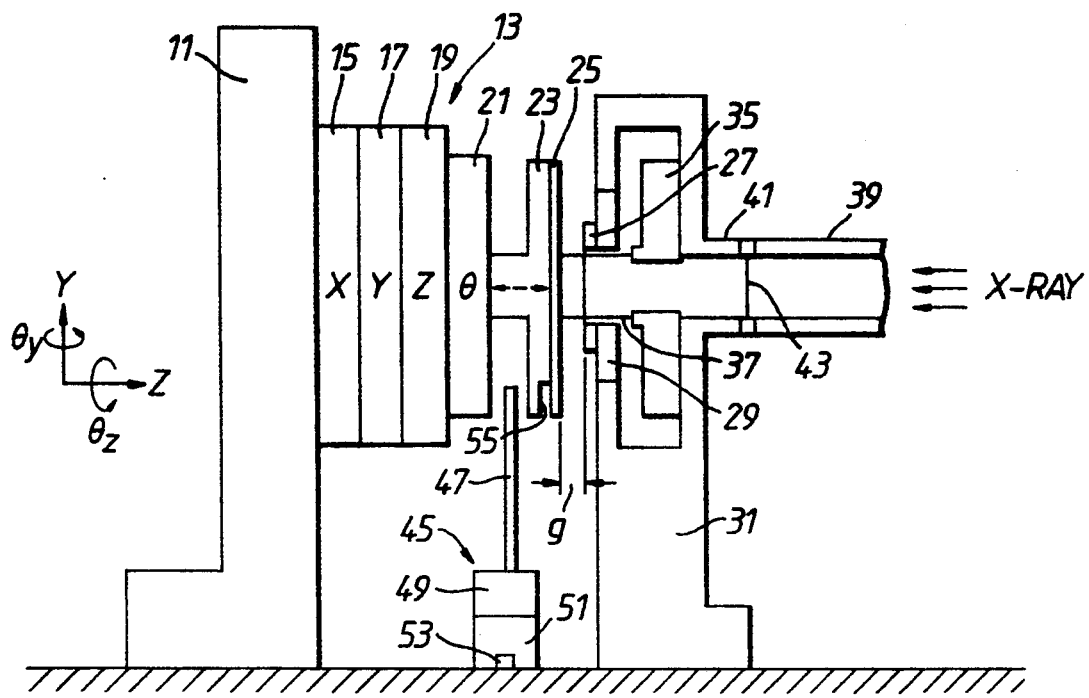
FIG. 4 and FIG. 5 show vertical sectional views of an embodiment of the present invention.

The vertical type X-ray exposure apparatus as shown in FIG. 4 is one of the preferred embodiments of the present invention. The exposure apparatus transfers circuit patterns as described on the mask 27 to a semiconductor wafer 25 by the step and repeat processes with X-ray exposure.

The FIG. 4 shows a fundamental structure of the exposure apparatus.

The exposure area (not shown) of this apparatus is 25 mm square in the case of this embodiment. On the other hand, the diameter of the semiconductor wafer 25 is 6 inch (150 mm$\phi$) or more. So the semiconductor wafer 25 is shifted 25 mm or more to both the X-direction and the Y-direction on every exposure step. Finally the circuit patterns (mask patterns) are transferred to the whole surface of the semiconductor wafer 25. Therefore the wafer stage frame 11 has a wafer table 13 which comprises an X-stage 15 and a Y-stage 17 which are able to shift to X-direction and Y-direction respectively. The wafer table 13 also comprises a Z-stage 19 and a $\theta$-stage 21. The Z-stage 19 moves the position of the semiconductor wafer 25 in Z-direction slightly and the $\theta$-stage 21 has three degrees of freedom which are $\theta$x-rotation, $\theta$y-rotation and $\theta$z-rotation respectively. The Z-stage 19 and the $\theta$-stage 21 are applied to fix the value of the gap g between the semiconductor wafer 25 and the mask 27.

The wafer table 13 is equipped with the wafer chuck plate 23 to hold and release alternatively the semiconductor wafer 25 by vacuum pressure. The wafer chuck plate 23 shifts in Z-direction independently from the wafer table 13. By the wafer chuck plate 23 shifting close to the mask 27, the gap g is determined. The value of g is about 30 μm long in this embodiment.

A mask frame 31 is equipped with a mask chuck plate 29 to fix the mask 27 by vacuum pressure. The mask chuck plate 29 is equipped with a fine adjustment (not shown) which determines the position of the mask 27 in three directions X, Y, Z and three rotations θx, θy, θz.

An alignment system 35 is installed in the mask frame 31 to position the semiconductor wafer 25 and the mask 27. The marks on the semiconductor wafer 25 and the mask 27 are detected by LASER beam 37 from the alignment system 35. Then the position of the semiconductor wafer 25 is finely adjusted by the X-stage 15, Y-stage 17 and θ-stage 21 of the wafer table 13. The position of the mask is also finely adjusted. In such way the gap g is adjusted precisely.

The semiconductor wafer 25 is exposed with X-rays from the X-ray source through a port 39 connected to the mask frame 31. A beryllium film 43 is installed between a port 39 and a back port 41 of the mask frame 31. The inside of the back port 41 is kept at a high vacuum and the inside of the mask frame 31 is kept at atmospheric pressure with He-gas.

A wafer carrier apparatus 45 is installed between the wafer stage frame 11 and the mask frame 31 to carry the semiconductor wafer 25 to the wafer chuck plate 23 to set the semiconductor wafer 25 be held or released. The wafer carrier apparatus 45 comprises a rotor arm 47, a Z-direction loader 49, an X-direction loader 51 and a rail 53. The rotor arm 47, which extend vertically to the position where the semiconductor wafer 25 is fixed, holds and releases alternately the semiconductor wafer 25 by vacuum chucking or electrostatic chucking and so on. The Z-direction loader 49 and the X-direction loader 51 move the rotor arm 47 in the Z-direction and X-direction (perpendicular to paper) respectively with a carrier means such as a motor or air cylinder device. The rail 53 guides the X-direction loader 51 when the in X-direction loader 51 moves in X-direction.

Figure 5:
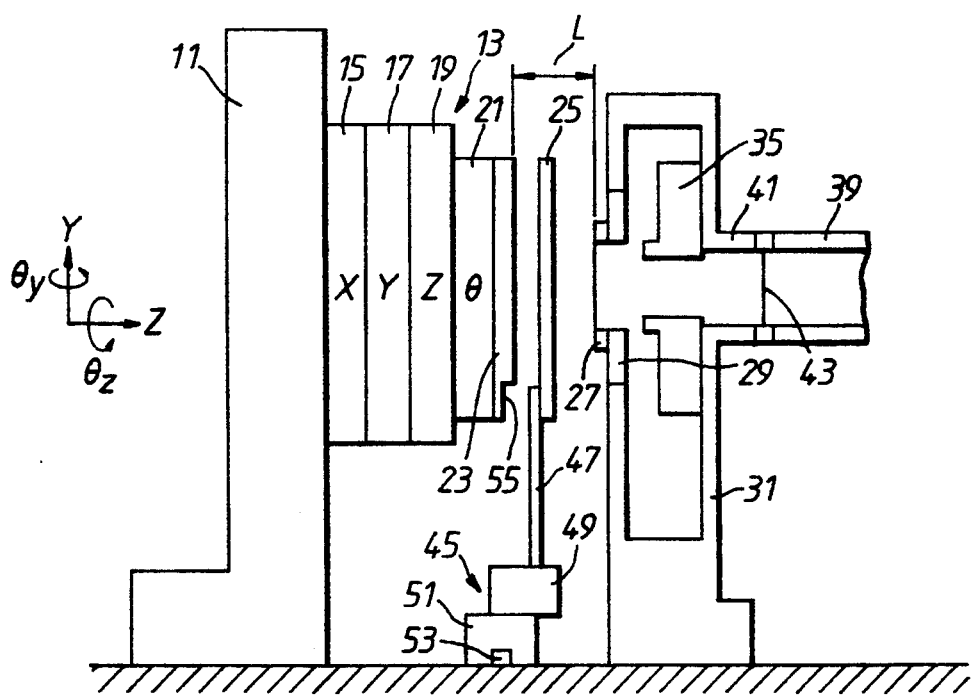
Figure 6:
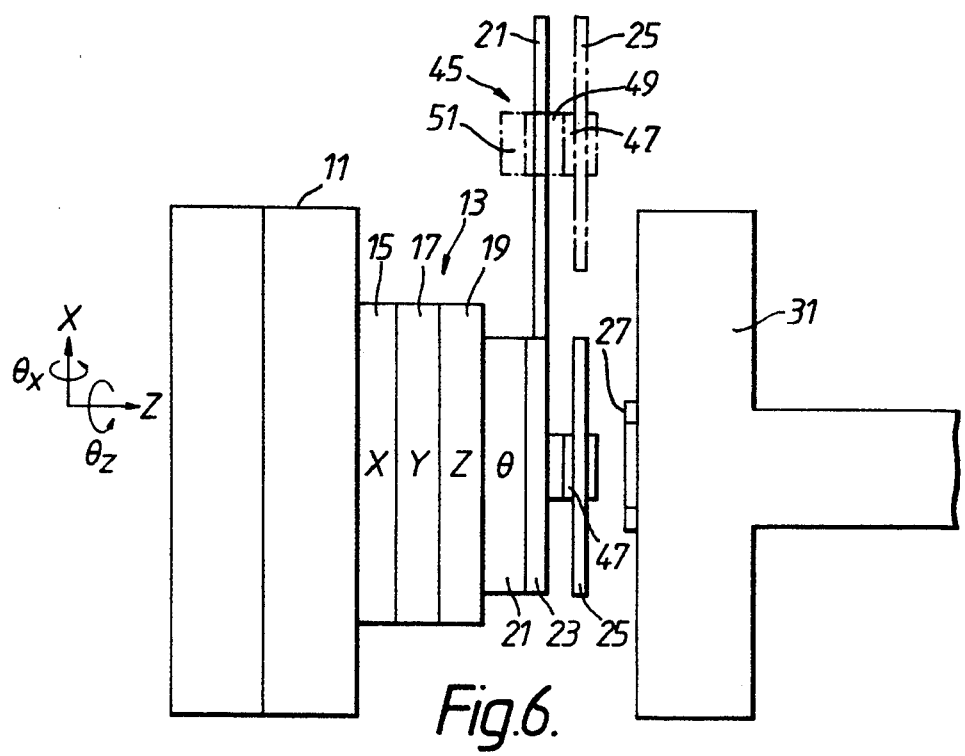
FIG. 6 shows a partial plan view of an embodiment of the present invention.

FIG. 5 and FIG. 6 show how the apparatus of the present invention holds the semiconductor wafer 25 on the wafer chuck plate 23.

The wafer chuck plate 23 is moved away from the mask 27 and a space L between the mask 27 and the wafer chuck plate 23 is expanded. To hold or to release the semiconductor wafer 25 or the mask 27, the size of the space L should be 6 mm or more. It is very difficult for the Z-stage 19 to move back 6 mm or more precisely to fix the gap g between the semiconductor wafer 25 and the mask 27 for exposing. Therefore in the present embodiment the wafer chuck plate 23 shifts in Z-direction independently from the wafer table 13. The wafer chuck plate 23 can shift its position regardless of the wafer table positions.

The semiconductor wafer 25 is held by the rotor arm 47 at the lower part of the semiconductor wafer 25 shown as a chain double-dashed line drawing in FIG. 6. Then the semiconductor wafer 25 is carried by the X-direction loader 51 in negative X-direction to the position against the wafer chuck plate 23. After that, the semiconductor wafer 25 on the rotor arm 47 is carried in the negative Z-direction to the wafer chuck plate 23 and fixed on the wafer chuck plate 23 by vacuum chucking. This is the first position. The wafer chuck plate 23, has a notch 55 in the lower part of its surface such as seen FIG. 7 or FIG. 8. The top end of the rotor arm 47 enters in the notch 55 when the semiconductor wafer 25 is fixed on the wafer chuck plate 23.

The details of the chucking mechanisms as described above are shown in FIG. 7 and FIG. 8.

Figure 7:
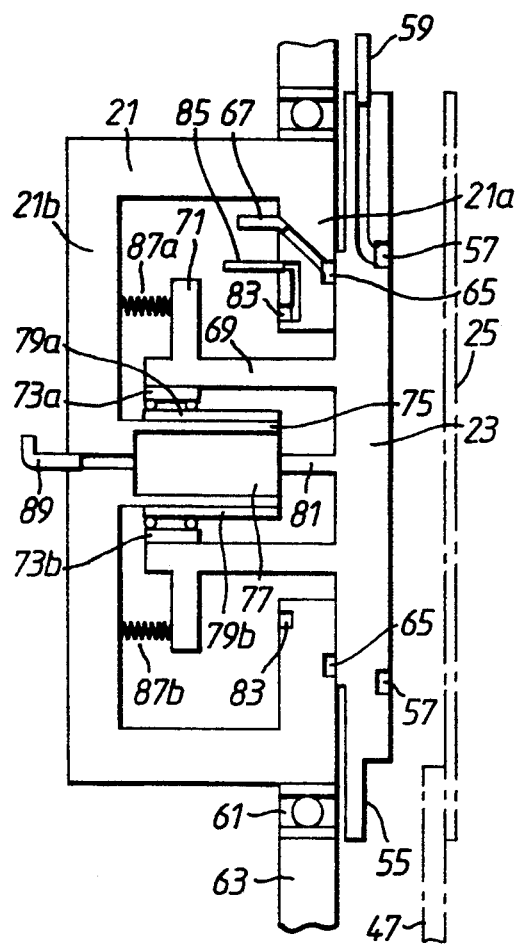
FIG. 7 and FIG. 8 show partial vertical sectional views of an embodiment of the present invention; and, FIG. 9 and FIG. 10 show partial plan views of other embodiment of the present invention.
Figure 8:
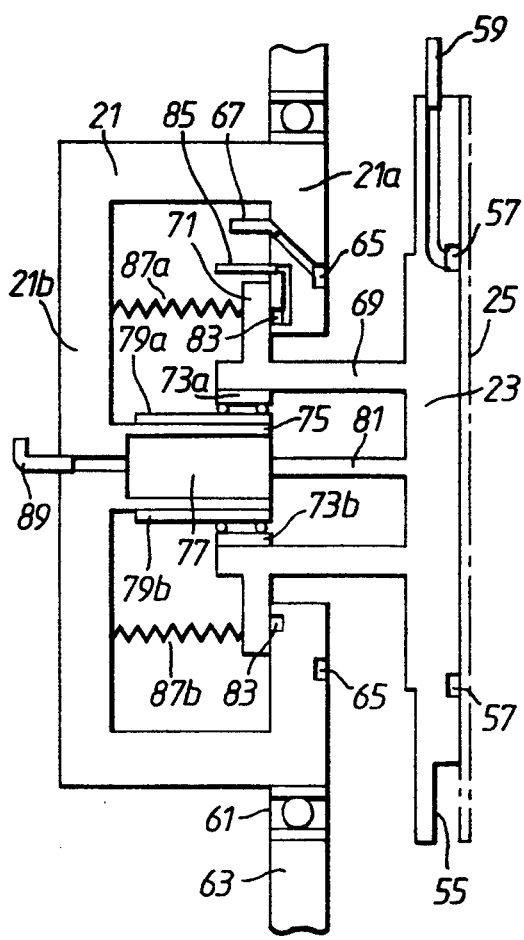

Before the semiconductor wafer 25 is fixed on the wafer chuck plate 23, the state of the withdrawn wafer chuck plate 23 into the θ-stage 21 is shown in the FIG. 7. The state of the protruding wafer chuck plate 23 from the θ-stage 21 is shown in FIG. 8 after the semiconductor wafer 25 is fixed on and carried close to the mask 27. Then the semiconductor wafer 28 is exposed by X-rays passed through the mask 27.

A wafer vacuum chucking cavity 57 is shaped on the surface of the wafer chuck plate 23 to hold the semiconductor wafer 25 (described with double-dashed lines in FIG. 7). A vacuum suction pipe 59 is connected to the vacuum chucking cavity 57. The θ-stage 21 is composed of a ring-shaped member 63 connected to θ-stage 21 through bearings 61 in order to be able to move in θz-rotation. On the front plate 21a of the θ-stage 21 side of the wafer chuck plate 23, a vacuum chucking cavity 65 is shaped to hold the wafer chuck plate 23 at the back side of the chuck plate 23. A vacuum suction pipe 67 is also connected to the vacuum chucking cavity 65. The semiconductor wafer 25 is fixed on the wafer chuck plate 23 by vacuum pressure and both the semiconductor wafer 25 and the wafer chuck plate 23 can shift as one body.

A hollow protuberance 69 shaped like an annular tube or a polygonal tube is connected to the back side of the wafer chuck plate 23. A ring-shaped flange 71 is connected to the outside of the protuberance 69. Tracks 73a and 73b are installed on the inside of the protuberance 69 for making the wafer chuck plate 23 removable.

A protuberance 75 shaped like an annular tube or a polygonal tube is connected to the central part in the back plate 21b of the θ-stage 21. The protuberance 75 is projected into the hollow protuberance 69 toward the wafer chuck plate 23. A cylinder 77 is installed in the hollow protuberance 75. A piston (not shown) in the cylinder 77 is movable in positive and negative Z-directions by gas pressure.

Rails 79a, 79b are installed on the outside of the hollow protuberance 75 in Z-direction as a guide for the tracks 73a, 73b. The rod 81 from the piston (not shown) is connected to the back side of the wafer chuck plate 23.

A vacuum cavity 83 is formed on the inside surface of the front plate 21a of the θ-stage 21. In order to suck and fix the flange 71 a vacuum suction pipe 85 is connected to the vacuum cavity 83. Springs 87a, 87b are installed between the back plate 21b of the θ-stage 21 and the flange 71.

The movement of the structure as described above is as follows.

In the FIG. 7 a pressure is supplied to the piston in the cylinder 77 through a gas leading port 89 and the vacuum of the vacuum cavity 65 which has fixed the wafer chuck plate 23 in the first position is broken. Next the wafer chuck plate 23 is shifted to the second position where the wafer chuck plate 23 contacts with the back side of the front plate 21a of the θ-stage (as shown in FIG. 8). At this moment vacuum cavity 83 is evacuated through vacuum pipe 85 to fix the flange 71 on the front plate 21a of the θ-stage 21. Then the θ-stage 21, connected to the Z-stage 19 of the wafer table 13, and wafer chuck plate 23 are united and shift in one body.

In this state the position of the wafer chuck plate 23 is very close to the mask 27 (not shown in FIG. 8). At this point the semiconductor wafer 25 fixed on the wafer chuck plate 23 is moved slightly by X-stage 15, Y-stage 17 and θ-stage 21 in these directions to determine a proper position. Then the gap g is adjusted to the right distance by the Z-stage 19 and the semiconductor wafer 25 is exposed by the X-rays.

On the other hand, when the vacuum in the vacuum suction pipe 85 is broken and the pressure in the cylinder 77 is reduced, the wafer chuck plate 23 is shifted from the second position to the first position by the elastic force of the springs 87a, 87b. Then vacuum cavity 65 is evacuated through vacuum pipe 67 to fix the wafer chuck plate 23 on the θ-stage 21. In this state there is a sufficient space L (shown in FIG. 5) for the semiconductor wafer 25 to be fixed or be released. So it becomes very easy to fix on or release from the wafer chuck plate 23.

In the preferred embodiment described above, the cylinder 77 and the piston are applied as a means for shifting the wafer chuck plate 23. Instead of the cylinder and the piston, a voice coil motor (VCM) is another suitable means for shifting the wafer chuck plate 23. Other suitable means for shifting the wafer chuck plate 23 are a pneumatic actuator such as a pneumatic motor, a electric actuator such as a electromagnetic solenoid, a piezo electric device, an ultrasonic wave motor, and an inchworm formed elastic member made of synthetic muscles made of rubber. Rotary movement by a rotary-type actuator which is transformed into a linear movement may also be used as a means for shifting.

On the other hand, as a means for fixing the wafer chuck plate 23 on the back plate 21a of the θ-stage 21, an application of electromagnetic force such as an electrostatic chuck is available.

A structure in which the semiconductor wafer is fixed on or released from the wafer chuck plate 23 in a horizontal instead of in a vertical orientation as described above, but the above concepts equally apply to vertical orientation.

Figure 9:
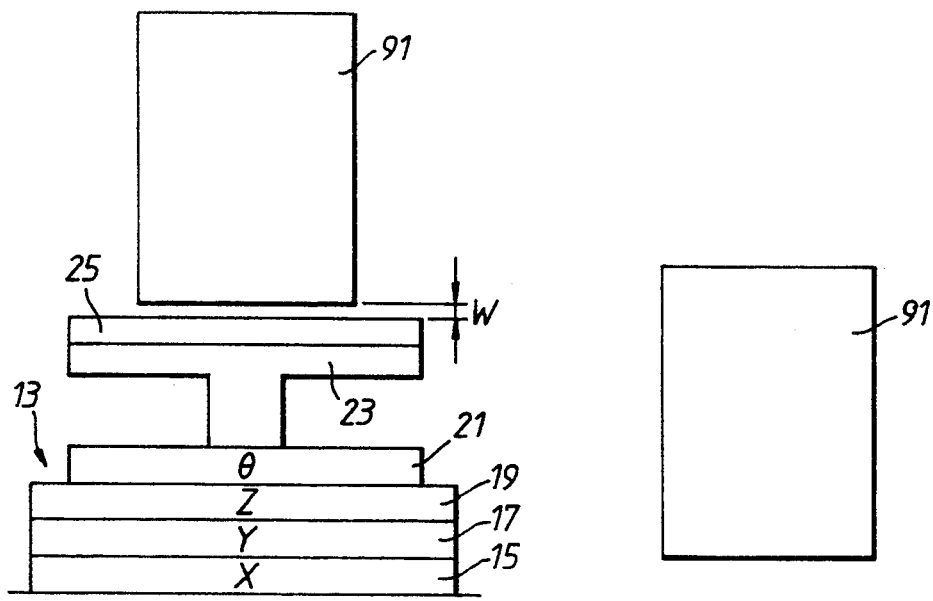
Figure 10:
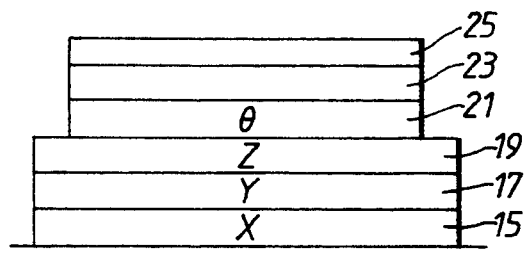

Another example is shown in FIG. 9 and FIG. 10. These show application of the present invention to a reduction projection exposure apparatus (optical stepper) with a projection lens 91.

In the case of this application, finer circuit patterns can be transferred if larger numerical aperture lenses are applied. Therefore it is necessary that big diameter lenses be applied and the working distance W between the lens 91 and the semiconductor wafer 25 be made small. When the distance W becomes very small, the semiconductor wafer 25 may hit against the projection lens.

In this embodiment having the structure as described above, the wafer chuck plate 23 can move up and down against the wafer table 13. When the semiconductor wafer 25 is exposed, the wafer chuck plate 23 on which the semiconductor wafer 25 is fixed moves toward the projection lens 91 as shown in FIG. 9. When the semiconductor wafer 25 is put on the wafer chuck plate 23 or released from the wafer chuck plate 23, the wafer chuck plate 23 is moved away from the projection lens 91 as shown in FIG. 10. Therefore it becomes very easy to put the wafer on or release the wafer from the wafer chuck plate 23.

The present invention has been described with respect to a specific embodiments. However, other embodiments based on the principles of the present invention should be obvious to those of ordinary skill in the art. Such embodiments are intended to be covered by the claims.

What is claimed is:

1. An exposing method for exposing a surface of a target using an exposure apparatus having
    a mask with a pattern,
    an energy source generating an exposure beam to expose the pattern on the mask on the surface of the target when the target is located in a path of the exposure beam,
    holding means for alternately holding and releasing the target,
    carrying means for carrying the target to the holding means, shifting means for coarsely shifting the holding means in a direction perpendicular to the surface of the target between a first location where the target is alternately held and released, and a second location where the target is exposed, and
    moving means for finely moving said holding means when said holding means is in the second location, the first location being closer to the moving means than the second location,
    the method comprising the steps of:
    (a) shifting the holding means to the first location using the shifting means;
    (b) carrying the target to the holding means using the carrying means;
    (c) holding the target with the holding means;
    (d) shifting the holding means from the first location to the second location using the shifting means;
    (e) fixing the holding means to the moving means;
    (f) adjusting the exposing position of the target at the second location using the moving means; and
    (g) exposing the target to the pattern on the mask with the exposure beam.

2. The method according to claim 1, wherein the step of shifting the holding means to the first location includes the step of fixing the holding means to the moving means when the holding means has reached the first location.

3. The method according to claim 1, wherein the step of adjusting the exposing position of the target at the second location includes the step of detecting a gap between the target and the mask to finely adjust the gap.

4. The method according to claim 1, wherein a gap between the target and the mask at the first location has a width in which the carrying means is able to be inserted.

5. The method according to claim 1, wherein a gap between the target and the mask at the second location has a suitable width for exposure.

6. The method according to claim 1, wherein the exposure beam is an electromagnetic radiation beam.

7. The method according to claim 1, wherein the exposure beam is an X ray beam.

8. The method according to claim 1, further comprising the steps of:
    (h) shifting the holding means with the exposed target to the first location using the shifting means after the step of exposing the target is finished; and
    (i) carrying the exposed target from the holding means using the carrying means.

9. The method according to claim 8, wherein the step of shifting the holding means with the exposed target to the first location includes the step of fixing the holding means to the moving means when the holding means has reached the first location.

* * * * *